United States Patent [19]

Hashimoto et al.

[11] Patent Number: 4,507,572
[45] Date of Patent: Mar. 26, 1985

[54] VOLTAGE SENSING CIRCUIT

[75] Inventors: Shingo Hashimoto; Mitsuo Sekine, both of Tokorozawa, Japan

[73] Assignee: Citizen Watch Co., Ltd., Tokyo, Japan

[21] Appl. No.: 618,771

[22] Filed: Jun. 11, 1984

Related U.S. Application Data

[62] Division of Ser. No. 339,609, Jan. 15, 1982, abandoned.

[30] Foreign Application Priority Data

Jan. 20, 1981 [JP] Japan .................................. 56-007019
Jan. 21, 1981 [JP] Japan .................................. 56-007666

[51] Int. Cl.³ .......................... H03K 3/353; G05F 3/08
[52] U.S. Cl. ................................ 307/296 R; 307/297; 323/314; 330/277
[58] Field of Search ................... 307/296 R, 297, 304; 323/313, 314; 330/277

[56] References Cited

U.S. PATENT DOCUMENTS

| | | | |
|---|---|---|---|
| 3,975,648 | 8/1976 | Tobey, Jr. et al. | 307/296 |
| 4,301,380 | 11/1981 | Thomas | 307/362 |
| 4,309,627 | 1/1982 | Tabata | 307/362 |
| 4,327,321 | 4/1982 | Suzuki et al. | 307/297 |

*Primary Examiner*—John Zazworsky
*Attorney, Agent, or Firm*—Jordan and Hamburg

[57] ABSTRACT

A voltage sensing circuit is disclosed, which utilizes a reference voltage generating circuit for producing a reference voltage whose value is determined as a function of absolute temperature, independent of circuit element variations, the reference voltage being generated by means of a pair of MOS field effect transistors having different values of Id/K, where Id is drain current and K is the channel pattern ratio W/L.

1 Claim, 16 Drawing Figures

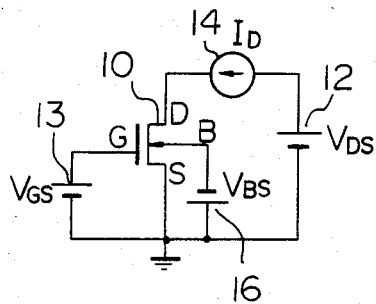
Fig. 1 PRIOR ART
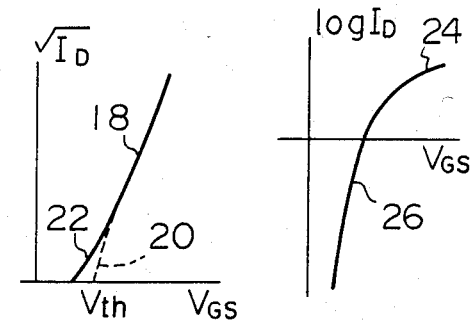
PRIOR ART Fig.2(a)   PRIOR ART Fig.2(b)
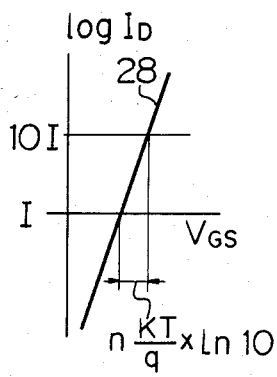
PRIOR ART Fig.3(a)
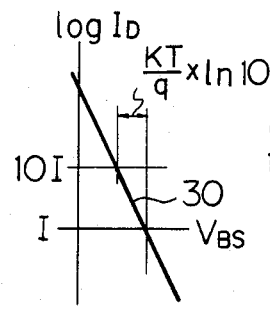
PRIOR ART Fig.3(b)
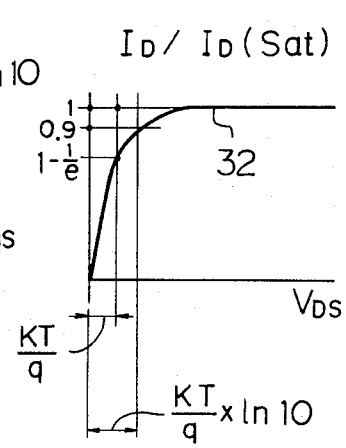
PRIOR ART Fig.3(c)

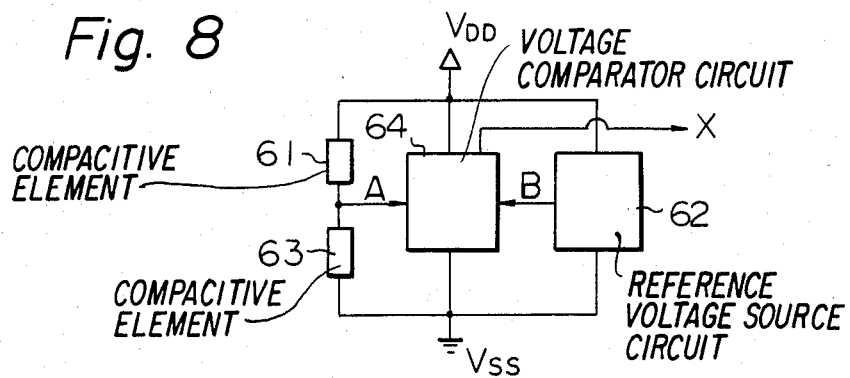
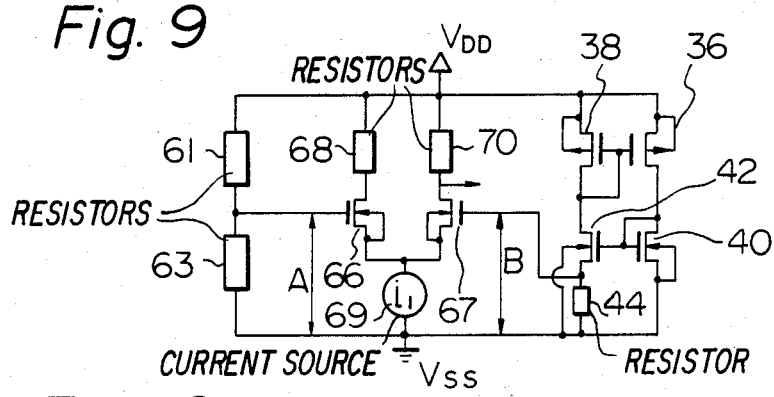
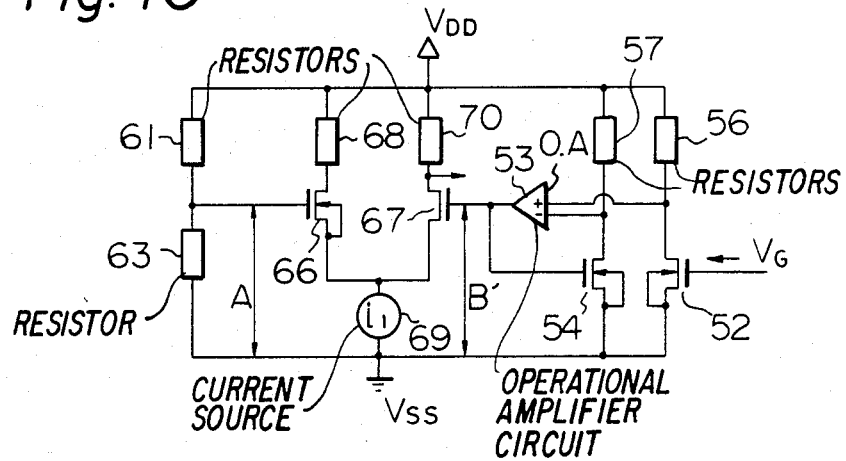

VOLTAGE SENSING CIRCUIT

This application is a division of application Ser. No. 339,609 filed Jan. 15, 1982 now abandoned.

BACKGROUND OF THE INVENTION

The present invention relates to a voltage sensing circuit in which a reference voltage generating circuit is operative to produce a reference voltage whose value is determined as a function of absolute temperature, with the reference voltage level being made independent of the individual characteristics of elements in the reference voltage generating circuit.

It is necessary to provide an accurately defined reference voltage, in a voltage sensing circuit, so as to provide a reference by which the voltage level to be sensed can be compared. It is necessary, therefore, that the reference voltage level either be predetermined by suitable circuit design, or that adjustment means such as external adjustment terminals be provided. In the prior art, elements such as Zener diodes have been utilized to produce a reference voltage in voltage sensing circuits, so that the degree of accuracy of the reference voltage is determined by the individual characteristics of such an element. Thus, due to manufacturing variations, it is difficult to achieve a high degree of accuracy in the reference voltage level, without selection of particular elements or providing external adjustment means.

There is therefore a requirement for a voltage sensing circuit having a reference voltage generating circuit which produces an accurately defined reference voltage whose level will be substantially independent of variations in element characteristics, so that element selection or external adjustment of the reference voltage level is unnecessary. These requirements are especially important for a voltage sensing circuit which is to be formed within an integrated circuit chip, and are met by a voltage sensing circuit according to the present invention as described herein.

SUMMARY OF THE INVENTION

A voltage sensing circuit according to the present invention is provided with a reference voltage generating circuit for producing a reference voltage whose level is a known and fixed function of absolute temperature, i.e. is determined by the physical quantity $kT/q$, where $k$ is Boltzmans constant, $T$ is absolute temperature, and $q$ is unit electric charge. This reference voltage is produced by utilizing two MOS field effect transistors which have different values of the ratio $Id/K$, where $Id$ is drain-to-source current and $K$ is the channel pattern ratio $W/L$. The reference voltage produced by such a circuit is not affected by variations in the individual MOS transistor characteristics, e.g. variations in threshold voltage $Vth$, but is determined only by the ratio of $Id/K$ of one transistor to $Id/K$ of the other transistor. In such a reference voltage generating circuit, the levels of drain current in the MOS transistors are held to a sufficiently low level that there is a linear relationship between the logarithm (to base e) of drain current and the gate-to-source voltage.

BRIEF DESCRIPTION OF THE DRAWINGS

FIG. 1 is a circuit diagram for illustrating the basic relationships between the drain current and various bias voltages of an MOS field effect transistor;

FIGS. 2a and 2b and FIGS. 3a–3c are graphs for illustrating the relationships between gate-to-source, substrate-to-source and drain-to-source voltages of an MOS field effect transistor and drain current, in the low-current region;

FIG. 8 is a block diagram for help in describing the principles of a voltage sensing circuit;

FIG. 9 is a circuit diagram of a first embodiment of a voltage sensing circuit according to the present invention;

FIG. 10 is a circuit diagram of a second embodiment of a voltage sensing circuit according to the present invention.

DESCRIPTION OF THE PREFERRED EMBODIMENTS

Figure 4:
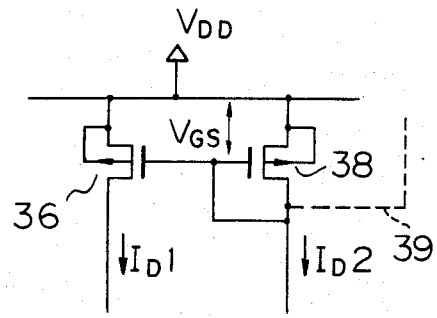
FIG. 4 is a circuit diagram for illustrating the operation of a current mirror circuit.

Before describing the embodiments of the present invention, some properties of MOS field effect transistors which are relevant to the present invention will be considered. Referring first to FIG. 1, various bias voltages which can be applied to an N-channel MOS transistor are shown. In the drawing, numeral 10 denotes an N-channel MOS transistor, numeral 12 a voltage source for applying a bias Vds between the drain and source electrodes of the MOS transistor, numeral 13 denotes a voltage source for applying a potential Vgs between the gate and source electrodes of MOS transistor 10, while 16 denotes a voltage source for applying a potential Vbs between the substrate and the source electrode of MOS transistor 10. Numeral 14 denotes an ampere meter which displays the drain-source current level Id. The gate, source and drain electrodes of MOS transistor 10 are indicated by the letters G, S and D in the drawing, while the substrate is indicated by letter B. In general, in the case of an N-channel MOS transistor, the potentials Vds and Vgs are generally greater than zero, i.e. positive, while potential Vbs is generally zero or less than zero.

The relationships between the bias potentials Vds, Vgs and Vbs of an MOS transistor and the drain current Id generally correspond to characteristics of square-law form. Thus, for example if it is assumed that the potential Vds is greater than or equal to (Vgs−Vth), where Vth is the threshold voltage of the transistor, then the relationship between Id and Vgs can be represented by the following equation:

$$Id = \frac{\beta}{2}(Vgs - Vth)^2 \quad (1)$$

where $$\beta = \mu \frac{\epsilon_{ox}}{t_{ox}} \cdot \frac{W}{L}$$

(where $\mu$ is the carrier mobility of the MOS transistor, and $\epsilon_{ox}$ and $t_{ox}$ are the dielectric constant and the thickness, of a gate insulator film, for example, the silicon oxide layer, of the MOS transistor, and where W and L are the width and the length respectively of the channel region of the MOS transistor).

Thus, from equation (1) above, the following equation can be derived:

$$\sqrt{Id} = \sqrt{\frac{\beta}{2}} \; (Vgs - Vth) \tag{2}$$

It can be seen from equation (2) that there is a linear relationship between $\sqrt{Id}$ and Vgs. However, if the relationship between $\sqrt{Id}$ and Vgs is plotted for an actual MOS transistor, then the resultant characteristic has the form shown in FIG. 2(a). As can be seen, the characteristic has a linear region 18, corresponding to operation at a relatively high level of Id, and has a non-linear region 22, corresponding to operation at low levels of Id.

If the relationship between the logarithm of Id to base e (abbreviated hereinafter simply to log) and Vgs is plotted, then the characteristic shown in FIG. 2(b) is obtained. This has an exponential region 24 corresponding to operation at high levels of Id, and a linear region 26 corresponding to operation at low levels of current Id. The relationship between potentials Vgs, Vbs and Vds in the low current region is given by the following equation:

$$Id = \frac{W}{L} I_O e^{\frac{qVgs}{nkT}} \left( e^{-\frac{qVbs}{kT}} - e^{-\frac{qVds}{kT}} \right) \tag{3}$$

In the above equation, k denotes Boltzmans constant, T is absolute temperature, and n=1+Cd/Cox, where Cd is the capacitance of the depletion region of the channel of the MOS transistor and Cox is the capacitance of the silicon oxide layer of the gate electrode of the MOS transistor. $I_O$ is a constant. kT/q is a physical quantity which is expressed in units of volts, and which varies in proportion to absolute temperature. At normal room temperatures, kT/q has a value of the order of 26 mV (i.e. has this value at an absolute temperature, of about 300° K.). If it is assumed that Vbs is zero, and that Vds is much greater than kT/q, then, from equation (3) the following can be derived:

$$Id = A \cdot e^{\frac{qVgs}{nkT}} \tag{4}$$

where A is equal to $W/L.I_O$

The result of changing Id by a factor of 10, in the low-current region of Id, will now be considered. It will be assumed that Id is changed between a value Id1 and a value Id2, such that the value Id2 is 10 times Id1. The values of Vgs for current values Id1 and Id2 will be designated as Vgs1 and Vgs2 respectively. The following can then be derived:

$$Id2 = 10 \cdot Id1 = A \cdot e^{\frac{q}{nkT} Vgs2}$$

$$Id1 = A \cdot e^{\frac{q}{nkT} Vgs1}$$

By combining the latter two equations and taking the logarith (to base e), the following equation is obtained:

$$\log 10 = \frac{q}{nkT} (Vgs2 - Vgs1)$$

$$(Vgs2 - Vgs1) = \frac{nkT}{q} \times \log 10 \tag{5}$$

It can thus be seen from equation (5) that if the current flow in the low-current operating region of an MOS transistor is varied by ten times, then a change in Vgs of value n.kT/q.log 10 will occur. This is illustrated by the graph of FIG. 3(a), in which log Id is plotted along the vertical axis and Vgs is plotted along the horizontal axis, with the linear characteristic relating these in the low-current region being denoted by numeral 28.

If on the other hand the voltage between gate and substrate Vgb is assumed to be held constant, and that the potential between the drain and substrate, Vdb is much greater than kT/q, then there is also a linear relationship between log Id and Vbs in the low-current region of Id, as shown in FIG. 3(b). In this case, a change in magnitude of ten times in the level of Id corresponds to a change in Vbs of log 10.kT/q.

Similarly, if it is assumed that Vbs is zero, and that Vgb=Vgs and is fixed, then the following is true from equation (3) above:

$$Id = B \left( 1 - e^{-\frac{q}{kT} VDs} \right)$$

where B is a constant. This relationship is analagous to that in an electrical circuit whereby current $$i = i_O \left( 1 - e^{-\frac{t}{\tau}} \right).$$

It can thus be understood that the relationship has the characteristic shown in FIG. 3(c), denoted by numeral 32. Here, the ratio Id/Id(sat) is plotted along the vertical axis, where Id(sat) is the saturation current level of the MOS transistor, while Vds is plotted along the horizontal axis. As shown, a change in Id/Id(sat) from zero to a value of (1−1/e) results in a change of kT/q in Vds, while a change in Id/Id(sat) from zero to 0.9 corresponds to a change of log 10.kT/q in Vds.

Referring now to FIG. 4, a circuit diagram is shown for illustrating the operation of a current mirror circuit, which is known in the prior art. In this example, the current mirror circuit comprises a pair of P-channel MOS transistors, 36 and 38, whose gate electrodes are connected in common to the drain electrode of MOS transistor 38. Thus, an identical potential Vgs is applied between the gate and source electrodes of both transistors 36 and 38 whose value will vary with the level of drain current Id2 flowing in MOS transistor 38, if both Vds in MOS transistors 36 and 38 are much greater than kT/q, both MOS transistors operate by equation (4) above, $$Id = W/L \cdot I_0 \cdot e^{\frac{q}{nkT} Vgs}$$

where $I_O$ is a constant. Thus, if Vgs is assumed fixed, then Id will vary in proportion to W/L of an MOS transistor. Accordingly, if the channel pattern ratio W/L of transistor 36 is denoted as K1 and that of MOS transistor 38 as K2, then the ratio of the drain current Id1 of MOS transistor 36 to drain current Id2 of MOS transistor 38 will be given as:

$$Id1/Id2 = K1/K2$$

Thus, if it is assumed that K1=K2, then Id1 and Id2 will be equal, while if K2=10K1, then Id2=10Id1. If the drain electrode of transistor 38 is connected to the gate electrodes of one or more P-channel MOS transistors, i.e. by lead 39, then it will be apparent that the same relationship will be established between the drain currents of these transistors and Id2 as that described for Id1, i.e. the drain currents will be determined in accordance with the W/L ratios of such other transistors.

Figure 5:
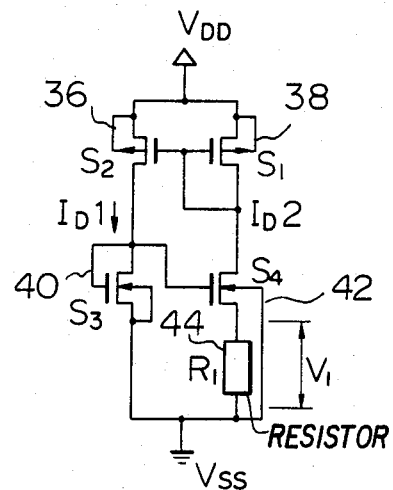
FIG. 5 is a circuit diagram of a reference voltage generating circuit for use with a voltage sensing circuit according to the present invention.

Referring now to FIG. 5, a circuit is shown which has been disclosed in the prior art (in IEEE, Sc-12, No. 3, June '77, pp224 to 231), which produces an output voltage whose level is determined by the physical quantity kT/q. In FIG. 5, MOS transistors 36 and 38 form a current mirror circuit as described above. The drain electrode of MOS transistor 38 is connected to the drain electrode of an N-channel MOS transistor 42, whose source electrode is connected to the Vss potential through a resistor 44, and whose substrate is connected to the Vss potential. The drain electrode of MOS transistor 36 is connected to the drain and gate electrodes of an N-channel MOS transistor 40. The substrate and source electrode of MOS transistor 40 are connected to the Vss potential, while the drain electrodes of MOS transistors 36 and 40 are coupled to the gate electrode of transistor 42. In this embodiment, the values of drain currents Id1 and Id2 are different, e.g. Id1=10Id2, with the ratio between these currents being determined by the relative values of channel pattern ratio W/L of transistors 36 and 38 forming the current mirror circuit, as described above, and transistors 40 and 42 have been manufactured identically, and have identical W/L ratios. With such a 10:1 current ratio, then if the substrate of MOS transistor 42 is connected to the Vss potential as in the example of FIG. 5, a voltage equal to log 10.kT/q will be developed across resistor 44, denoted in FIG. 5 as V1. In other words, the circuit of FIG. 5 acts to set the current Id2 to such a value as to cause a potential drop of value log 10.kT/q across resistor 44, whose value might for example be 1 megohm. If on the other hand the substrate and source electrode of MOS transistor 42 were connected together, then a voltage n.log 10.kT/q would be produced across resistor 42, as will be understood from the discussion hereinabove with reference to FIG. 3.

The voltage V1 thus produced has some important advantages for use as a reference voltage, due to the absolute nature of this voltage. At any particular temperature of operation, the value of V1 is fixed irrespective of variations in the circuit element characteristics and variations in supply voltage level, and is only determined by the channel pattern ratios W/L of the circuit MOS transistors. However if the circuit of FIG. 5 is formed within an integrated circuit, it is possible to determine the channel pattern ratios to a high degree of accuracy, and to manufacture MOS transistors 40 and 42 to have identical characteristics. The value of output voltage V1 will of course vary linearly with temperature variations. However the way in which this variation occurs is accurately known, so that if the operating temperature range of a circuit is sufficiently limited, then it is possible to use output voltage V1 as a reference voltage of known value, without the necessity for providing adjustment means for setting the reference voltage level to a required value. This is an extremely valuable feature for a reference voltage source to be formed by elements within an integrated circuit chip.

The value of the output voltage from the circuit of FIG. 5 is of the order of 100 mV at normal operating temperatures. This may be too low a value to be used directly as a reference voltage, in certain applications. It is possible to use conventional amplifier circuits to increase the level of voltage V1 to a required degree. However this is undesirable, if prior art types of linear amplifier circuits are used, since unless the amplifier circuit is relatively complex it will not be possible to avoid inaccuracy of the level of reference voltage thus produced, due to the effects of amplifier element characteristics. However this difficulty can be overcome by using a linear amplifier circuit having the configuration shown in FIG. 6. This comprises a P-channel MOS transistor 48 which is connected to the current mirror circuit of transistors 38 and 36, and a resistor 50 connected between the drain electrode of MOS transistor 48 and the Vss potential. The gate electrode of transistor 48 is connected to the gate and drain electrodes of MOS transistor 38, so that drain current level of MOS transistor 48, designated as Id3, is determined by the level of current Id2, as described hereinabove with reference to FIG. 4. In other words, if the channel pattern ratio W/L of MOS transistor 48 is made greater than that of MOS transistor 38, then the level of current Id3 will be proportionally higher than Id2, so that if resistor 50 is equal to or greater than resistor 44 in value, then the value of voltage V2 developed across resistor 50 will be equal to that of voltage V1 across resistor 44, multiplied by a constant factor whose value is greater than one, i.e. the circuit comprising MOS transistor 48 and resistor 50, coupled to the current mirror circuit of transistors 36 and 38 as shown, acts to amplify the reference voltage V1. If for example the W/L ratio of MOS transistor 48 is made ten times that of MOS transistor 38, then current Id3 will be ten times current Id2. Thus if both of resistors 44 and 50 have the same value (for example 1 megohm), then the value of output reference voltage V2 will be ten times voltage V1, i.e. will be of the order of 1 V at normal operating temperatures.

Such a linear amplifier circuit has the advantage of extreme simplicity, and a high degree of linearity of amplification when operated at low levels of current, and is highly suitable for use in an integrated circuit chip.

Figure 7:
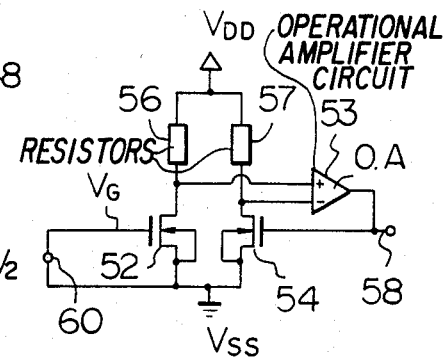
FIG. 7 is a circuit diagram of another example of a reference voltage generating circuit for a voltage sensing circuit according to the present invention.

Referring now to FIG. 7, another embodiment of a circuit according to the present invention for producing a reference voltage whose value is determined by the physical quantity kT/q will be described. This comprises two N-channel MOS transistors 52 and 54, which have resistors 56 and 58 connected between their respective drain electrodes and the Vdd potential. Numeral 53 denotes an operational amplifier circuit, whose inverting input is connected to the drain electrode of MOS transistor 54 and whose noninverting input is coupled to the drain electrode of MOS transistor 52, while the output of amplifier circuit 53 is connected to an output terminal 58 and to the gate electrode of MOS transistor 54. Numerals 56 and 57 devote resistors. Numeral 60 denotes an externally adjustable voltage source for producing a voltage of level VG, having a value of the order of 300 mV, for example. Voltage VG is applied to the gate electrode of MOS transistor 52, and the precise value of VG is set by external adjustment of voltage source 60. Operational amplifier circuit 53 acts to set the potential of the gate electrode of MOS transistor 54 to such a level that the potential difference between the input terminals of operational amplifier circuit 53 is reduced to zero, i.e. to control the level of drain current in MOS transistor 54 such as to set the potential at the drain electrode of MOS transistor 54 to be identical to that of the drain of MOS transistor 52. The channel pattern ratios of MOS transistors 52 and 54 must be different from one another, and it will be assumed for the purposes of description that the W/L ratio of MOS transistor 52 is ten times that of transistor 54 and resistors 56 and 57 are equal. In this case, since operational amplifier 53 acts to set the gate electrode potential of MOS transistor 54 such that the drain currents of transistors 52 and 54 are identical. Thus, as described hereinabove with reference to FIG. 3(a), the difference between the gate electrode potentials of MOS transistors 52 and 54 will be equal to K1/K2.log nkT/q, where K1 is the value of the W/L ratio of MOS transistor 52 and K2 is the W/L ratio of MOS transistor 54. In other words, if the potential at the output from operational amplifier 53 is denoted as Vc, then since voltage VG is applied to the gate electrode MOS transistor 52,:

$$Vc - VG = nkT/1 \times \log K1/K2$$
$$= nkT/1 \times \log 10, \text{ when } K1/K2 = 10.$$

Thus, the potential appearing on the output terminal 58 of the circuit of FIG. 7 is the sum of the voltage VG applied from external voltage source 60 and the physical quantity nkT/q×log 10. The latter quantity can be accurately defined, if the circuit of FIG. 7 is formed within an integrated circuit, since the parameters n, K1 and K2 can be accurately controlled during manufacture. Thus, the circuit of FIG. 7 is highly suited to providing a reference voltage source within an integrated circuit chip. In addition, the magnitude of the reference voltage thus produced can be varied, within a limited range, by external adjustment of the value of VG using voltage source 60.

Before describing embodiments of voltage sensing circuits according to the present invention, the basic principles of a voltage comparator circuit will be outlined, with reference to FIG. 8. As shown therein, a voltage sensing circuit basically comprises a voltage divider comprising resistive or capacitive elements 61 and 63 for producing a potential A which is a function of the potential whose level is to be sensed (in this case Vdd), a reference voltage source circuit 62 for producing a reference voltage B, and a voltage comparator circuit 64 for comparing the levels of voltages A and B, and for generating an output signal X to indicate an error in the level of voltage A. It is an essential requirement of such a circuit that the level of reference voltage B be independent of variations in the level of the potential to be sensed (i.e. in this case Vdd).

FIG. 9 shows a first embodiment of a voltage sensing circuit according to the present invention, which utilizes the circuit described hererinabove with reference to FIG. 5 for producing a reference voltage B whose value is determined by the physical quantity kT/q. As described hereinabove, if the value of W/L of MOS transistor 36 is ten times that of transistor 38 and value of W/L of MOS transistors 40 and 42 are equal, then the value of reference voltage B will be kT/q×log 10. This voltage is compared with a voltage A produced by voltage division of voltage Vdd through a voltage divider comprising resistors 61 and 63, by means of a voltage comparator circuit which comprises N-channel MOS transistors 66 and 67, a current source 69, and resistors 68 and 80, connected as shown to form a differential amplifier circuit. If the voltage to be sensed, i.e. Vdd, is output from a battery, then the level of reference voltage will be unaffected by changes in the level of Vdd, so long as this does not drop to a level such that MOS transistors 40 and 42 cease to operate within the low-current region referred to hereinabove.

Figure 6:
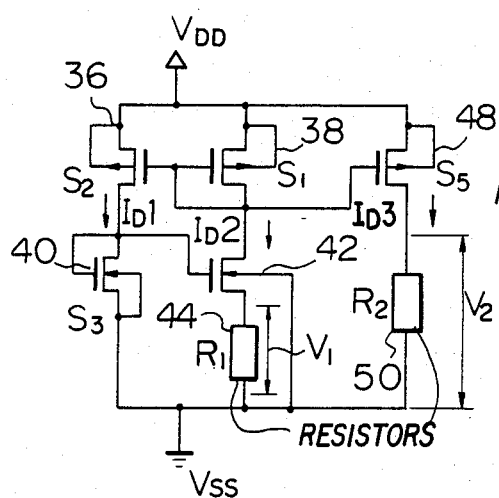
FIG. 6 is a circuit diagram of a linear amplifier circuit used in conjunction with the reference voltage generating circuit of FIG. 5.

It should be noted that, if necessary, the level of reference voltage B can be increased by utilizing the linear amplifier circuit of FIG. 6 described above.

FIG. 10 shows another embodiment of a voltage sensing circuit according to the present invention. This utilizes the circuit of FIG. 7 to produce a reference voltage B', for sensing voltage A produced from Vdd. Voltage VG applied to the gate electrode of MOS transistor 52 can be adjusted by external means coupled to a voltage source which generates VG, for thereby adjusting the level of reference voltage B'.

In the above description, it has been assumed that a reference voltage determined by the physical quantity kT/q is produced by making the W/L channel pattern ratios of MOS transistors 52 and 54 different. However, as stated hereinabove, if Vbs is zero and Vds is much greater than kT/q, then the drain current of an MOS transistor in the low-current region is given by equation (4), i.e.

$$Id = (W/L) \cdot I_0 e^{-\frac{q}{nkT}} Vds.$$

where $I_O$ is a constant. Hence, if two MOS transistors have drain currents Id1 and Id2 respectively, and W/L ratios of K1 and K2, then the difference between their gate-to-source potentials can be obtained from the equation:

$$(Vgs2 - Vgs1) = nkT/q \times \log (K1.Id2/K2.Id1) \qquad (6)$$

In other words, in order to generate the reference voltage B', it is necessary either that the values of drain current Id1 and Id2 be different, or if these are identical, that the values of K1 and K2 be different, between the two MOS transistors. Thus, with the circuit of FIG. 10, it is possible to arrange that MOS transistors 54 and 52 have identical values of W/L ratio but that the current which flows in MOS transistor 54 is greater than that which flows in transistor 52. This could be accomplished by making the value of resistor 57 one tenth of that of resistor 56. If this is done, then a voltage nkT/q×log 10 plus Vg applied to the gate electrode of MOS transistor 52 will again be obtained as the value of reference voltage B', i.e. the same value as will be obtained if the currents in MOS transistors 52 and 54 are identical but the values of W/L are in the ratio 10/1 as described above. It can thus be understood that the value of output voltage produced by the circuit of FIG. 7 is determined by the difference between the ratios of drain current Id to channel pattern ratio (W/L) (i.e. Id1/K1 and Id2/K2) of the two MOS transistors in the circuit.

A reference voltage generating circuit such as that of FIG. 7 can only generate an output voltage with reference to one of the supply voltage potentials of the circuit, i.e. either with reference to Vss in the case of a circuit using N-channel MOS transistors or with reference to Vdd in the case of a circuit using P-channel transistors. However in some cases it is desirable to utilize a reference voltage which is floating with respect to the supply voltage potentials.

Figure 11:
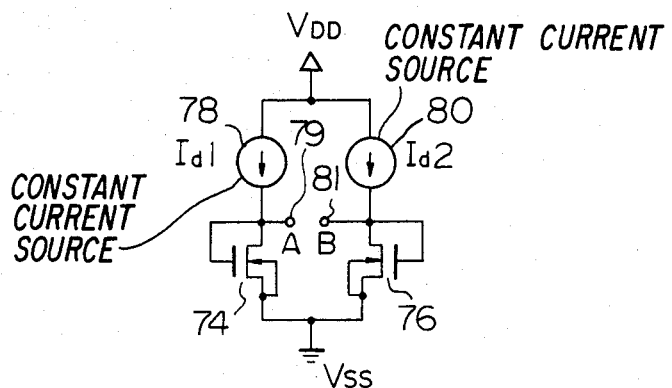
FIG. 11, FIG. 12 and FIG. 13 are circuit diagrams of examples of circuits for generating a reference voltage which is floating with respect to the power supply potentials of the reference voltage generating circuit.
Figure 12:
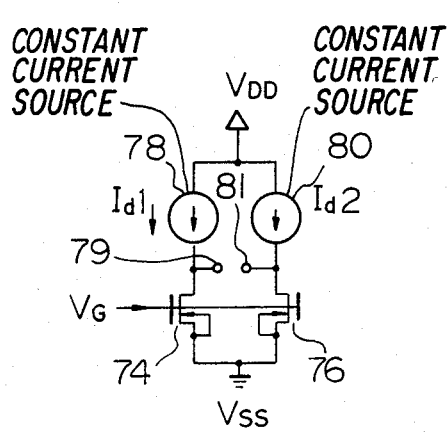
Figure 13:
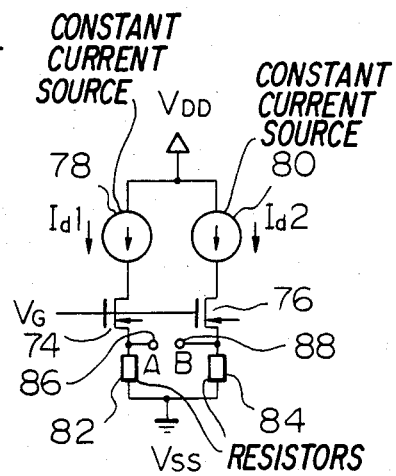

FIGS. 11, 12 and 13 show circuits which may be used in such a case. In the circuit of FIG. 11, constant current sources 78 and 80 are connected to the drain electrodes of MOS transistors 74 and 76, each of which has the drain and gate electrodes connected together. Thus, a potential difference Vr will be developed between terminals 79 and 81 which is given by the equation:

$$Vr = n.kT/q.\log Id1.K2/Id2.K1$$

where Id1 and K1 are the drain current and W/L ratio of MOS transistor 74 and Id2 and K2 are the drain current and W/L ratio of MOS transistor 76. Thus, if transistors 74 and 76 have been manufactured in the same way, to have identical values of W/L, then the value of Vr will be determined by the difference between Id1 and Id2, i.e. will be given as:

$$Vr = nkT/q.\log Id1/Id2$$

On the other hand, if currents Id1 and Id2 are made identical, and the values of W/L for transistors 74 and 76 are made different, then the value of Vr will be given as:

$$Vr = nkT/q.\log K2/K1$$

In the example of FIG. 12, the gate electrodes of both of N-channel MOS transistors 74 and 76 are connected in common to a fixed voltage VG, and again the drain currents in these transistors are determined by current sources 78 and 80. The MOS transistors 74 and 76 will be assumed to have been manufactured to be identical, i.e. to have the same value of W/L, and it will also be assumed that the currents Id1 and Id2 of transistors 74 and 76 have been adjusted such that the difference between the values of Vds of these transistors, for example, the value of potential difference Vr between terminals 79 and 81, is equal to the physical quantity (log 10−1)×kT/q. This could be done by adjusting the values of Id1 and Id2 to 0.9Id/Id(sat) and (1−1/e)Id/Id(sat) respectively as illustrated in FIG. 3(c). However, it will be apparent that so long as the ratio of Id/(W/L) is different for transistors 74 and 76, then a potential difference Vr will be developed between terminals 79 and 81 whose value will be proportional to the physical quantity kT/q.

FIG. 13 shows an example of a circuit in which a fixed voltage Vg is applied to the gate electrodes of both of MOS transistors 74 and 76, and the reference voltage is developed between a terminal 86, connected to the junction of the source electrode of transistaor 74 and a resistor 82, and a terminal 88 which is connected to the source electrode of transistor 76 and a resistor 84. By connecting the substrates of both of transistors 74 and 76 to the source electrodes of these transistors, or connecting both of the substrates to the Vs potential, or by connecting one substrate to the corresponding source electrode and the other to the Vss potential, various different values of reference voltage including kT/q, n.kT/q, (n−1).kT/q, or combinations of these voltages can be produced between terminals 86 and 88.

It will be understood from the preceding description that it is an essential feature of a voltage sensing circuit according to the present invention that a reference voltage for voltage sensing purposes is generated by a circuit which includes two MOS field effect transistors having different values of the ratio (Id/K) therebetween, where Id is the drain-to-source current of a transistor and K is the channel pattern ratio W/L, where W is channel width and L is channel length. Such a reference voltage generating circuit is basically different in operation from circuits which utilize the square-law characteristics of a transistor, e.g. the relationship between drain current and Vgs at relatively high levels of current. With such a circuit, or a circuit which utilizes a voltage reference element such as a zener diode, the level of the reference voltage produced will be dependent upon the individual element characteristics. With a reference voltage generating circuit of a voltage sensing circuit according to the present invention, on the other hand, the reference voltage is determined by the physical quantity kT/q, and is not dependent upon the transistor characteristics. It will be understood also from the above that a reference voltage produced by a reference voltage generating circuit in a voltage sensing circuit according to the present invention will have a positive temperature coefficient. However, in some applications, this will be a distinct advantage, since the temperature coefficient is accurately known. For example, in sensing the voltage of a battery such as a silver oxide cell, the battery voltage has a positive temperature coefficient, i.e. the battery voltage increases with increasing operating temperature, and decreases with a reduction of operating temperature. Thus, if a reference voltage having zero temperature coefficient were used in a voltage sensing circuit used to detect that a battery is approaching the end of its operating life, by sensing a drop in battery voltage, then such a voltage sensing circuit might indicate that the battery life is ended when a reduction in battery voltage occurs as a result of a fall in ambient operating temperature. With a voltage sensing circuit using a reference voltage generating circuit according to the present invention, e.g. the circuit of FIG. 7, on the other hand, the level of the reference voltage will also fall at low levels of ambient operating temperature, so that a drop in battery voltage resulting therefrom will not be sensed as indicating the end of battery life.

From the preceding description, it will be apparent that the objectives set forth for the present invention are effectively attained. Since various changes and modifications to the above construction may be made, without departing from the spirit and scope of the present invention, it is intended that all matter contained in the above description or shown in the accompanying drawings shall be interpreted as illustrative, and not in a limiting sense. The appended claims are intended to cover all of the generic and specific features of the invention described herein.

What is claimed is:

1. A reference voltage generating circuit, comprising:

first and second MOS field-effect transistors having the source and substrate electrodes thereof connected in common to a first supply potential, and with the gate electrodes thereof connected in common;

a third MOS field-effect transistor having the gate and drain electrodes thereof connected in common to the drain electrode of said first MOS field-effect transistor, and the substrate and source electrodes thereof connected in common to a second supply potential;

a fourth MOS field-effect transistor having the gate electrode thereof connected to the drain electrodes of said first and third MOS field-effect transistors, the drain electrode thereof connected to the drain electrode of said second MOS field-effect transistor, the substrate electrode connected to said second supply potential, and the source electrode thereof connected through a first resistor to said second supply potential;

a fifth MOS field-effect transistor having the gate electrode thereof connected to the drain electrodes of said second and fourth MOS field-effect transistors, the substrate and source electrodes thereof connected to said first supply potential, and the drain electrode thereof connected to said second supply potential through a second resistor;

the value of the ratio K of the channel width to channel length of said second MOS field-effect transistor being a predetermined multiple of the ratio of channel width to channel length of said first MOS field-effect transistor, and the ratio of channel width to channel length of said fifth MOS field-effect transistor being a predetermined multiple of the ratio of channel width to channel length of said second MOS field-effect transistor, whereby a reference voltage of amplitude determined by the relative channel dimensions of said first, second and fifth MOS field-effect transistors and by the ratio of the resistance values of said first and second resistors is developed across said second resistor.

* * * * *